(12) United States Patent
Matsumoto (10) Patent No.: US 9,503,020 B2
(45) Date of Patent: Nov. 22, 2016

(54) OSCILLATOR, ELECTRONIC APPARATUS, AND MOVING OBJECT

(71) Applicant: Seiko Epson Corporation, Tokyo (JP)

(72) Inventor: Yoshiaki Matsumoto, Ina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/858,291

(22) Filed: Sep. 18, 2015

(65) Prior Publication Data

US 2016/0087584 A1   Mar. 24, 2016

(30) Foreign Application Priority Data

Sep. 24, 2014  (JP) ................................. 2014-193979

(51) Int. Cl.
*H03B 5/36*       (2006.01)

(52) U.S. Cl.
CPC ....... *H03B 5/368* (2013.01); *H03B 2200/0026* (2013.01); *H03B 2201/025* (2013.01)

(58) Field of Classification Search
CPC ... H03B 5/368; H03B 5/366; H03B 2200/08
USPC ......... 331/49, 162, 179, 116 R, 116 FE, 158
See application file for complete search history.

(56) References Cited

U.S. PATENT DOCUMENTS

| 6,756,863 B2 * | 6/2004 | Oita ........................ H03B 5/36 331/107 A |
| 7,102,454 B2 * | 9/2006 | Sze ....................... H03C 3/0958 331/117 FE |

FOREIGN PATENT DOCUMENTS

| JP | 2005-006130 A | 1/2005 |
| JP | 2006-005697 A | 1/2006 |
| JP | 2008-060841 A | 3/2008 |
| JP | 2008-228141 A | 9/2008 |

* cited by examiner

*Primary Examiner* — Ryan Johnson
(74) *Attorney, Agent, or Firm* — Harness, Dickey & Pierce, P.L.C.

(57) ABSTRACT

An oscillator includes a first VCXO and a second VCXO which are capable of changing an output frequency by application of a control voltage, and a control voltage terminal to which the control voltage is applied, the first VCXO includes a variable-capacitance diode (first variable-capacitance diode) and a resistor (first resistor), the second VCXO includes a variable-capacitance diode (second variable-capacitance diode) and a resistor (second resistor), the cutoff frequency of the first variable-capacitance diode, the second variable-capacitance diode, the first resistor, and the second resistor is equal to the cutoff frequency of the first variable-capacitance diode and the first resistor, and the cutoff frequency of the second variable-capacitance diode and the second resistor.

19 Claims, 9 Drawing Sheets

OSCILLATOR, ELECTRONIC APPARATUS, AND MOVING OBJECT

BACKGROUND

1. Technical Field

The present invention relates to an oscillator, an electronic apparatus, and a moving object.

2. Related Art

The reference frequencies used for backbone lines such as a synchronous optical network (SONET) and a synchronous digital hierarchy (SDH) are required to correspond to different frequencies from each other. For this purpose, equipment related to a transmission device used for backbone lines is provided with a plurality of oscillation units capable of respectively oscillating frequency signals different from each other, and is configured to select a certain oscillation unit to output a desired frequency signal, by a selection signal or the like from the outside.

For example, JP-A-2005-6130 discloses a two-frequency switching-type high-frequency quartz crystal oscillator including a first quartz crystal oscillation unit that outputs a first frequency signal, a second quartz crystal oscillation unit that outputs a second frequency signal, a first switch for supplying power to any one of the first quartz crystal oscillation unit and the second quartz crystal oscillation unit, by a selection signal from the outside, and a second switch that selects any one of the outputs of the first quartz crystal oscillation unit and the second quartz crystal oscillation unit, by a selection signal from the outside.

In this two-frequency switching-type high-frequency quartz crystal oscillator, the frequencies of the frequency signals which are output from the first quartz crystal oscillation unit and the second quartz crystal oscillation unit are adjusted, by controlling the capacitance of the variable-capacitance diode included in the first quartz crystal oscillation unit and the capacitance of the variable-capacitance diode included in the second quartz crystal oscillation unit by a frequency control voltage.

Further, the first quartz crystal oscillation unit further includes a resistor, and the characteristics of the above-described variable-capacitance diode and the resistor are appropriately selected, depending on the output frequency that is obtained by the first quartz crystal oscillation unit.

Similarly, the second quartz crystal oscillation unit also further includes a resistor, and the characteristics of the above-described variable-capacitance diode and the resistor are appropriately selected, depending on the output frequency that is obtained by the second quartz crystal oscillation unit.

The two-frequency switching-type high-frequency quartz crystal oscillator of such a configuration is easily miniaturized, as compared with the case of providing a structure for switching the application of the frequency control voltage, between the first quartz crystal oscillation unit and the second quartz crystal oscillation unit.

However, in the two-frequency switching-type high-frequency quartz crystal oscillator described in JP-A-2005-6130, since the line for applying a frequency control voltage is connected to both the first quartz crystal oscillation unit and the second quartz crystal oscillation unit at all times, when an alternating current (AC) component is superimposed on the frequency control voltage, the cutoff frequency (modulation bandwidth frequency) of the oscillator is influenced by the respective characteristics of the variable-capacitance diode and the resistor included in the first quartz crystal oscillation unit and the variable-capacitance diode and the resistor included in the second quartz crystal oscillation unit. For this reason, when the two-frequency switching-type high-frequency quartz crystal oscillator described in JP-A-2005-6130 is incorporated into a circuit, there is a possibility that the cutoff frequency of the AC component superimposed on the frequency control voltage changes significantly depending on the characteristics of the variable-capacitance diode and the resistor that are included in each quartz crystal oscillation unit, as compared to the related art. In other words, when using the two-frequency switching-type high-frequency quartz crystal oscillator described in JP-A-2005-6130, instead of the one-frequency type quartz crystal oscillator that is not a frequency switching type, there is a possibility that the cutoff frequencies of the AC component superimposed on the frequency control voltage before and after replacement are largely different from each other. In this way, if the cutoff frequencies are largely different, there is a possibility that the synchronization operation of the quartz crystal oscillation unit becomes unstable.

SUMMARY

An advantage of some aspects of the invention is to provide an oscillator which is compact and performs a stable operation, and an electronic apparatus and a moving object, which are provided with the oscillator.

The invention can be implemented as the following forms or application examples.

APPLICATION EXAMPLE 1

An oscillator according to this application example includes: a first voltage-controlled oscillator circuit capable of changing an output frequency by application of a control voltage; a second voltage-controlled oscillator circuit capable of changing an output frequency by application of the control voltage; and a control voltage terminal to which the control voltage is applied, in which the first voltage-controlled oscillator circuit includes a first variable-capacitance diode to which the control voltage is applied, and a first resistor provided between the control voltage terminal and the first variable-capacitance diode, in which the second voltage-controlled oscillator circuit includes a second variable-capacitance diode to which the control voltage is applied, and a second resistor provided between the control voltage terminal and the second variable-capacitance diode, and in which a cutoff frequency when the control voltage is applied to the first variable-capacitance diode, the second variable-capacitance diode, the first resistor, and the second resistor is equal to a cutoff frequency when the control voltage is applied to the first variable-capacitance diode, and the first resistor, and a cutoff frequency when the control voltage is applied to the second variable-capacitance diode and the second resistor.

With this configuration, since a structure for switching circuits that apply control voltages is not necessary, a structure can be simplified, and a significant change in the cutoff frequency can be prevented even when using the oscillator, it is possible to achieve an oscillator which is compact and performs a stable operation.

APPLICATION EXAMPLE 2

An oscillator according to this application example includes: a first voltage-controlled oscillator circuit capable of changing an output frequency by application of a control voltage; a second voltage-controlled oscillator circuit capable of changing an output frequency by application of the control voltage; and a control voltage terminal to which the control voltage is applied, in which the first voltage-controlled oscillator circuit includes a first variable-capacitance diode to which the control voltage is applied, and a first resistor provided between the control voltage terminal and the first variable-capacitance diode, in which the second voltage-controlled oscillator circuit includes a second variable-capacitance diode to which the control voltage is applied, and a second resistor provided between the control voltage terminal and the second variable-capacitance diode, in which the first variable-capacitance diode and the second variable-capacitance diode are the same type of components as each other, and in which the first resistor and the second resistor are the same type of components as each other.

With this configuration, since a structure for switching circuits applying control voltages is not necessary, a structure can be simplified, and a significant change in the cutoff frequency can be prevented even when using the oscillator, it is possible to achieve an oscillator which is compact and performs a stable operation.

APPLICATION EXAMPLE 3, APPLICATION EXAMPLE 4

In the oscillator of the application example, it is preferable that the oscillator further includes: a power switching circuit that supplies a power supply voltage to any one of the first voltage-controlled oscillator circuit and the second voltage-controlled oscillator circuit.

With this configuration, it is possible to supply the power supply voltage while switching the first voltage-controlled oscillator circuit and the second voltage-controlled oscillator circuit, by operating the power switch circuit based on the selection signal. As a result, power consumption can be reduced, and the occurrence of electromagnetic interference waves due to energization can be suppressed.

APPLICATION EXAMPLE 5, APPLICATION EXAMPLE 6, APPLICATION EXAMPLE 7, APPLICATION EXAMPLE 8

In the oscillator of the application example, it is preferable that the oscillator further includes: an oscillator output terminal for outputting output signals of the first voltage-controlled oscillator circuit and the second voltage-controlled oscillator circuit; and an output switching circuit, in which the first voltage-controlled oscillator circuit further includes a first output terminal, in which the second voltage-controlled oscillator circuit further includes a second output terminal, and in which the output switching circuit switches connection between the first output terminal and the oscillator output terminal and connection between the second output terminal and the oscillator output terminal.

With this configuration, it is possible to output the frequency signal to the oscillator output terminal while switching the first output terminal and the second output terminal, by operating the output switching circuit based on the selection signal.

APPLICATION EXAMPLE 9, APPLICATION EXAMPLE 10, APPLICATION EXAMPLE 11, APPLICATION EXAMPLE 12

In the oscillator of the application example, it is preferable that the first voltage-controlled oscillator circuit and the second voltage-controlled oscillator circuit respectively include a quartz crystal oscillation unit, and a tuning circuit that tunes the output frequency into a frequency of a high-order wave output from the quartz crystal oscillation unit.

With this configuration, since a fundamental frequency with high frequency accuracy is obtained, an oscillator with high frequency accuracy is obtained.

APPLICATION EXAMPLE 13, APPLICATION EXAMPLE 14, APPLICATION EXAMPLE 15, APPLICATION EXAMPLE 16, APPLICATION EXAMPLE 17

In the oscillator of the application example, it is preferable that the oscillator further includes: a package that houses the first voltage-controlled oscillator circuit and the second voltage-controlled oscillator circuit.

With this configuration, since it is possible to protect the first voltage-controlled oscillator circuit and the second voltage-controlled oscillator circuit from an external force and an environmental change, a reliable oscillator is obtained.

APPLICATION EXAMPLE 18

An electronic apparatus according to this application includes the oscillator of the application example described above.

With this configuration, a highly reliable electronic apparatus is obtained.

APPLICATION EXAMPLE 19

A moving object according to this application includes the oscillator of the application example described above.

With this configuration, a highly reliable moving object is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an oscillator, an electronic apparatus, and a moving object according to the invention will be described in detail based on respective embodiments illustrated in the accompanying drawings.

1. Oscillator Circuit

First, an oscillator circuit provided in an embodiment of an oscillator according to the invention will be described.

Figure 1:
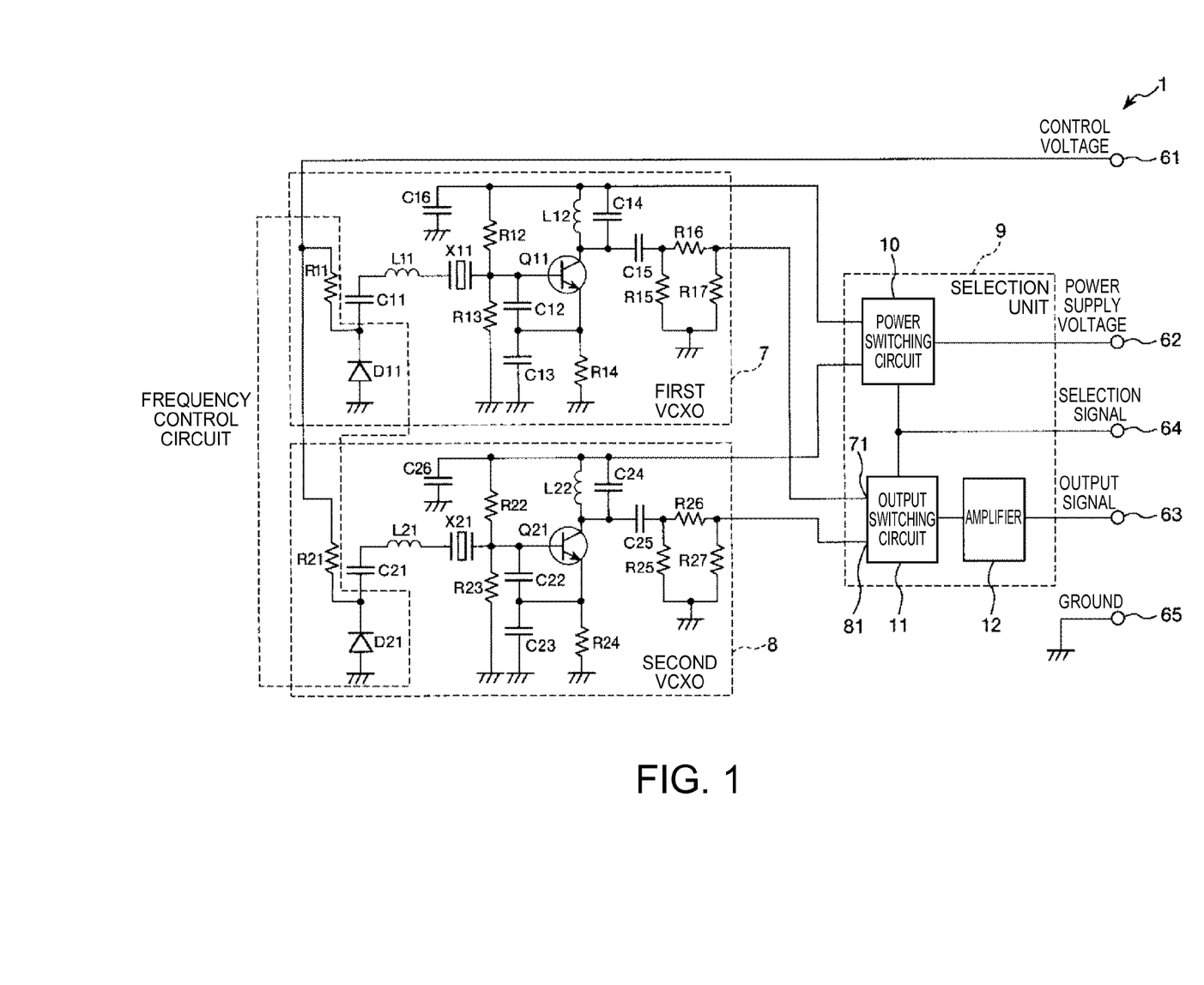
FIG. 1 is a block diagram illustrating an oscillator circuit provided in an embodiment of an oscillator according to the invention.

FIG. 1 is a block diagram illustrating an oscillator circuit provided in the embodiment of the oscillator according to the invention.

The oscillator circuit 1 illustrated in FIG. 1 is an example in which two voltage-controlled oscillator circuits (VCXO) are provided in a single substrate. The oscillator circuit 1 illustrated in FIG. 1 includes a first VCXO 7 that outputs a desired first frequency signal by a control voltage applied from the outside, a second VCXO 8 that outputs a desired second frequency signal by a control voltage applied from the outside, and a selection unit 9 that selects the output of the first VCXO 7 and the second VCXO 8.

In addition, the selection unit 9 includes a power switching circuit 10 for applying (supplying) a power supply voltage to any one of the first VCXO 7 and the second VCXO 8 by a selection signal applied from the outside, an output switching circuit 11 that selects the output of any one of the first VCXO 7 and the second VCXO 8 by a selection signal applied from the outside, and an amplifier 12 that amplifies the selected frequency signal to a predetermined level.

Further, the oscillator circuit 1 includes a control voltage terminal 61 for applying a control voltage to the first VCXO 7 and the second VCXO 8, a power supply terminal 62 that applies a power supply voltage to the power switching circuit 10, an oscillator output terminal 63 that outputs a frequency signal amplified by the amplifier 12 to the outside, a selection signal terminal 64 for inputting a selection signal to the selection unit 9, and a ground terminal 65 which is electrically grounded.

Hereinafter, the configuration of each part of the oscillator circuit 1 will be described in more detail. In addition, the configuration described below is an example of the configuration of the oscillator circuit included in the oscillator according to the invention, and the invention is not limited thereto.

The first VCXO 7 illustrated in FIG. 1 includes a so-called Colpitts oscillation circuit.

Specifically, the first VCXO 7 first includes a resistor R11 (a first resistor), a variable-capacitance diode D11 (a first variable-capacitance diode), a capacitor C11, an expansion coil L11, and a resonator X11 (oscillation unit). The control voltage is input to one end of the resistor R11 from the outside. Further, the other end of resistor R11 is connected to the cathode side of the variable-capacitance diode D11 and one end of the capacitor C11. Further, the other end of the capacitor C11 is connected to one end of the expansion coil L11, and the other end of the expansion coil L11 is connected to one end of the resonator X11.

In addition, the first VCXO 7 further includes a transistor Q11, a resistor R12, a resistor R13, a resistor R14, a capacitor C12, a capacitor C13, a capacitor C14, and a coil L12. The base of the transistor Q11, one end of the resistor R12, and one end of the resistor R13 are connected to the other end of the resonator X11. These resistor R12 and resistor R13 function as a base bias resistor. Then, the other end of the resistor R13 is grounded. Further, the capacitor C12 and the capacitor C13 which have some of the load capacitance are inserted in a state of being connected in series, to between the base of the transistor Q11 and the ground. Then, the connection point between the capacitor C12 and the capacitor C13 and the emitter of the transistor Q11 are connected, and the resistor R14 is inserted as an emitter resistor between the emitter of the transistor Q11 and the ground. Further, the coil L12 and the capacitor C14 are connected in parallel between the collector of the transistor Q11 and the power switching circuit 10. A tuning circuit that can be tuned to the harmonic frequency (higher-order wave) of a desired order number of the resonator X11 is configured, and a C tap is configured.

In addition, the first VCXO 7 further includes a capacitor C15, a capacitor C16, a resistor R15, a resistor R16, and a resistor R17. The coil L12 and the capacitor C14 on the power switching circuit 10 side are respectively grounded through the capacitor C16. Meanwhile, one end of the capacitor C15 is connected to the collector side of the coil L12 and capacitor C14. The other end of the capacitor C15 is connected to the output switching circuit 11 through an attenuator constituted by the resistor R15, the resistor R16, and the resistor R17. In other words, the output terminal 71 (first output terminal) that outputs a frequency signal from the first VCXO 7 is electrically connected to the output switching circuit 11 that is shared with the second VCXO 8, which will be described later. Although the attenuator illustrated in FIG. 1 is a so-called π-type unbalanced attenuator, as long as impedance matching and the output level are possible, the configuration of the attenuator is not limited thereto.

Such a first VCXO 7 performs signal amplification and waveform shaping such that the resonator X11 in the oscillation circuit continues the oscillation operation, while controlling the oscillation frequency of the resonator X11, depending on the control voltage applied from the outside. Thus, a first frequency signal of a desired frequency is output from the first VCXO 7.

Meanwhile, the second VCXO 8 illustrated in FIG. 1 also includes an oscillation circuit having the same configuration as in the first VCXO 7.

Specifically, the second VCXO 8 first includes a resistor R21 (a second resistor), a variable-capacitance diode D21 (a second variable-capacitance diode), a capacitor C21, an expansion coil L21, and a resonator X21. The control voltage is input to one end of the resistor R21 from the outside. Further, the other end of resistor R21 is connected to the cathode side of the variable-capacitance diode D21 and one end of the capacitor C21. Further, the other end of the capacitor C21 is connected to one end of the expansion coil L21, and the other end of the expansion coil L21 is connected to one end of the resonator X21.

In addition, the second VCXO 8 further includes a transistor Q21, a resistor R22, a resistor R23, a resistor R24, a capacitor C22, a capacitor C23, a capacitor C24, and a coil L22. The base of the transistor Q21, one end of the resistor R22, and one end of the resistor R23 are connected to the other end of the resonator X21. These resistor R22 and resistor R23 function as a base bias resistor. Then, the other end of the resistor R23 is grounded. Further, the capacitor C22 and the capacitor C23 which have some of the load capacitance are inserted in a state of being connected in series, to between the base of the transistor Q21 and the ground. Then, the connection point between the capacitor C22 and the capacitor C23 and the emitter of the transistor Q21 are connected, and the resistor R24 is inserted as an emitter resistor between the emitter of the transistor Q21 and the ground. Further, the coil L22 and the capacitor C24 are connected in parallel between the collector of the transistor Q21 and the power switching circuit 10. A tuning circuit that can be tuned to the harmonic frequency (higher-order wave) of a desired order number of the resonator X21 is configured, and a C tap is configured.

In addition, the second VCXO 8 further includes a capacitor C25, a capacitor C26, a resistor R25, a resistor R26, and a resistor R27. The coil L22 and the capacitor C24 on the power switching circuit 10 side are respectively grounded through the capacitor C26. Meanwhile, one end of the capacitor C25 is connected to the collector side of the coil L22 and the capacitor C24. The other end of the capacitor C25 is connected to the output switching circuit 11 through an attenuator constituted by the resistor R25, the resistor R26, and the resistor R27. In other words, the output terminal 81 (second output terminal) that outputs a frequency signal from the second VCXO 8 is electrically connected to the output switching circuit 11 that is shared with the first VCXO 7, which will be described later. Although the attenuator illustrated in FIG. 1 is a so-called π-type unbalanced attenuator, as long as impedance matching and the output level are possible, the configuration of the attenuator is not limited thereto.

Such a second VCXO 8 performs signal amplification and waveform shaping such that the resonator X21 in the oscillation circuit continues the oscillation operation, while controlling the oscillation frequency of the resonator X21, depending on the control voltage applied from the outside. Thus, a second frequency signal of a desired frequency is output from the second VCXO 8.

Further, the first VCXO 7 and the second VCXO 8 are respectively provided with resonators having a fundamental frequency of, for example, 150 MHz band. Then, the resonator X11 provided in the first VCXO 7 and the resonator X21 provided in the second VCXO 8 have fundamental frequencies different from each other in the frequency band.

Then, the selection unit 9 operates the power switching circuit 10 and the output switching circuit 11, by a selection signal applied from the outside. This enables one of the first VCXO 7 and the second VCXO 8 to be selected and operated. For example, when the first VCXO 7 is selected by switching the conduction path of the power switching circuit 10 and the conduction path of the output switching circuit 11, the power supply voltage is applied only to the first VCXO 7, the output terminal 71 and the oscillator output terminal 63 are connected, and only a frequency signal is input from the first VCXO 7 to the amplifier 12, and is output after being amplified to a predetermined level. When the second VCXO 8 is selected by switching the power switching circuit 10 and the output switching circuit 11, the power supply voltage is applied only to the second VCXO 8, the output terminal 81 and the oscillator output terminal 63 are connected, and only a frequency signal is input from the second VCXO 8 to the amplifier 12, and is output after being amplified to a predetermined level.

Since the power switching circuit 10 is provided in this way and it is possible to apply a power supply voltage to one that corresponds to the output frequency of interest, among the first VCXO 7 and the second VCXO 8, power consumption is intended to be reduced and the occurrence of electromagnetic interference waves due to energization can be suppressed.

In addition, it is possible to match the frequency tuned by each tuning circuit to a desired value (for example, the fundamental frequency of the resonator, or its integer multiple), by appropriately setting the tuning circuits included in the first VCXO 7 and the second VCXO 8.

For example, when the fundamental frequency of the resonator X11 provided in the first VCXO 7 is 155 MHz, it is possible to output the frequency signal of 155 MHz as the first frequency signal or to output the frequency signal of 622 MHz that is a fourth harmonic of the fundamental frequency as the first frequency signal, by the setting of the tuning circuit.

Further, when the fundamental frequency of the resonator X21 provided in the second VCXO 8 is 161 MHz, it is possible to output the frequency signal of 161 MHz as the second frequency signal or to output the frequency signal of 644 MHz that is a fourth harmonic of the fundamental frequency as the second frequency signal, by the setting of the tuning circuit.

In general, the tuning frequency f of the tuning circuit is obtained by the inductance L of the coil and the capacitance C of the capacitor constituting a parallel resonance circuit as follows: $[f=1/\{2\pi(LC)^{1/2}\}]$. Therefore, the coil and capacitor of the tuning circuit (parallel resonance circuit) may be appropriately selected in order to match the frequency tuned in the tuning circuit to a desired value.

In addition, in the present embodiment, the amplifier 12 is inserted between the output switching circuit 11 and the oscillator output terminal 63. Therefore, the amplifier 12 is shared by the first VCXO 7 and the second VCXO 8. Therefore, as compared with the case where amplifiers are separately provided, it is possible to reduce the number of amplifiers 12, and the oscillator circuit 1 can be miniaturized. Such a configuration is particularly useful, for example, when the used frequencies are close to each other, as a clock signal used in a SONET/SDH network or the like.

Meanwhile, if the amplifier 12 is not shared by the first VCXO 7 and the second VCXO 8, the oscillator circuit 1 may include, for example, an amplifier for the first VCXO 7 and an amplifier for the second VCXO 8.

In addition, the first VCXO 7 and the second VCXO 8 each may include a filter that removes unwanted frequency components from the frequency signal which is output therefrom. Examples of such a filter include a surface acoustic wave (SAW) filter, and the like.

Here, in the oscillator circuit 1 illustrated in FIG. 1, the control voltage terminal 61, to which a control voltage is applied, is shared by the first VCXO 7 and the second VCXO 8. Therefore, regardless of whether the frequency signal of the first VCXO 7 is output or the frequency signal of the second VCXO 8 is output, by the selection signals, the control voltage is applied to the first VCXO 7 and the second VCXO 8, respectively.

Then, an AC component is applied to the control voltage. In other words, the control voltage is subjected to the FM modulation (frequency modulation). In such a case, the AC component is cut in the resistor R11 and the resistor R21, but the cutoff frequency (modulation bandwidth frequency) of FM modulation is important to stabilize the synchronization operation of the first VCXO 7 and the second VCXO 8.

When a circuit that is connected to the control voltage terminal 61, and includes the resistor R11 and the variable-capacitance diode D11 provided in the first VCXO 7, and the resistor R21 and the variable-capacitance diode D21 provided in the second VCXO 8 is used as a "frequency control circuit", the cutoff frequency fc in the frequency control circuit is given by the following Expression (1).

$$fc = \frac{1}{2\pi \times \frac{R11 \times R21}{R11 + R21} \times (D11 + D21)} \quad (1)$$

In addition, R11 in the Expression (1) represents the resistance value of the resistor R11, R21 represents the resistance value of the resistor R21, D11 represents the capacitance of the variable-capacitance diode D11, and D21 represents the capacitance of the variable-capacitance diode D21.

Since the cutoff frequency fc of the frequency control circuit is determined on the basis of the synthetic resistance value of the resistors R11, R21 and the synthetic capacitance of the variable-capacitance diodes D11, D21, if the resistance value of the resistor R11 and the resistance value of the resistor R21 are different from each other, or the capacitance of the variable-capacitance diode D11 and the capacitance of the variable-capacitance diode D21 are different from each other, there is a possibility that the cutoff frequency fc is greatly changed as compared with the related art.

When the cutoff frequency fc of the frequency control circuit is greatly changed, that is, there is a possibility that it is not possible to perform a synchronization operation in the interior of the first VCXO 7 and the second VCXO 8, that is, it is not possible to make the resonators X11, X21 oscillate so as to output the output frequency of interest, and the operations of the oscillators including the oscillator circuit 1 become unstable.

Therefore, in the invention, the same kind of components as each other are used for the resistor R11 included in the first VCXO 7 and the resistor R21 included in the second VCXO 8. In addition, the same kind of components as each other are used for the variable-capacitance diode D11 included in the first VCXO 7 and the variable-capacitance diode D21 included in the second VCXO 8. The same type of components mean that, for example, the manufacturers are identical to each other, and, the part numbers are identical to each other.

It is possible to equalize the cutoff frequency fc of the frequency control circuit of the oscillation circuit 1 to the cutoff frequency when the control voltage subjected to the FM modulation is applied to either the first VCXO 7 or the second VCXO 8 by selecting the components. Therefore, even when using an oscillator including a two-frequency switching-type oscillation circuit 1 instead of a one-frequency type oscillator, it is possible to prevent the cutoff frequency fc of the frequency control circuit from being greatly changed. As a result, the stabilization of the synchronization operation in the interior of the first VCXO 7 and the second VCXO 8 can be achieved.

Here, in order to reflect this situation in the above Expression (1), the resistance value of the resistor R11 included in the first VCXO 7 and the resistance value of the resistor R21 included in the second VCXO 8 which are in equal relationship to each other are "R0". In addition, the capacitance of the variable-capacitance diode D11 included in the first VCXO 7 and the capacitance of the variable-capacitance diode D21 included in the second VCXO 8 which are in equal relationship to each other are "D0". Then, by substituting R11 and R21 in the above Expression (1) with R0, and substituting D11 and D21 of the Expression (1) with D0, the following Expression (2) is obtained.

$$fc = \frac{1}{2\pi \times \frac{R0 \times R0}{R0 + R0} \times (D0 + D0)} \quad (2)$$

$$= \frac{1}{2\pi \times \frac{R0^2}{2R0} \times 2D0}$$

$$= \frac{1}{2\pi \times R0 \times D0}$$

On the right side of the above Expression (2), the cutoff frequency fc1 when the control voltage that is FM-modulated is applied only to the first VCXO 7 is equal to the cutoff frequency fc2 when the control voltage that is FM-modulated is applied only to the second VCXO 8.

That is, the fc1 is expressed by the following Expression (3), and fc2 is expressed by the following Expression (4).

$$fc1 = \frac{1}{2\pi \times R0 \times D0} \quad (3)$$

$$fc2 = \frac{1}{2\pi \times R0 \times D0} \quad (4)$$

Therefore, it is established that fc=fc1=fc2 by the above Expression (2), the above Expression (3), and the above Expression (4).

In addition, in this manner, since the two-frequency switching type oscillator of which the cutoff frequency does not change can easily replace the one-frequency type oscillator, it is likely to be used in terms of enhancing the ease of design of the circuit.

In addition, if the cutoff frequency fc of the frequency control circuit of the oscillator circuit 1, the cutoff frequency fc1 when the control voltage that is FM-modulated is applied only to the first VCXO 7, and the cutoff frequency fc2 when the control voltage that is FM-modulated is applied only to the second VCXO 8 may be equal to each other, some deviations are acceptable.

For example, a difference between fc and fc1 and a difference between fc and fc2 is preferably 10% or less of fc, and is more preferably 5% or less. If the difference is within this range, since adverse effects due to the deviation of the cutoff frequency are not so obvious, it is possible to realize the oscillator circuit 1 of a two-frequency switching type of which operation is stable without a structure for switching the frequency control voltage.

Further, as described above, the same type of components mean that, for example, the manufacturers are identical to each other, and, the part numbers are identical to each other, in the case of discrete components. In other words, the design and manufacturing process of each part may be substantially identical. This makes frequency characteristics of each component equal to each other. For example, even when the frequency of the FM modulated control voltage is changed, it is possible to maintain the relationship of R11=R21 described above, and the relationship of D11=D21, and the effect described above is exhibited.

Further, it is possible to integrate the resistor or the variable-capacitance diode on a semiconductor substrate, for example, by using a CMOS process or the like. In the case where they are integrated in this way, the same type of components mean, for example, resistors or variable-capacitance diodes which designs are identical to each other, and that are manufactured in the same process. Thus, the frequency characteristics of respective components are equal to each other.

In addition, since the resistance value of the resistor and the capacitance of the variable-capacitance diode have some variations even in the same type of components, the characteristics are not completely identical in the same type of parts.

For example, in the case of resistors as discrete components, since the tolerance of the nominal resistance value is represented, the resistors are recognized as the same type of components as long as they are within the range. In addition, in the case of a typical resistor, the tolerance of resistance value may be equal to or less than 10% of the nominal resistance value.

Further, the oscillator circuit 1 may include any discrete components, integrated circuit components and the like, in addition to the illustrated configuration.

The oscillator circuit 1 may further include one or more voltage-controlled oscillator circuits (VCXO) equivalent to the first VCXO 7 and the second VCXO 8. In other words, the oscillator circuit 1 may further include three or more VCXOs. In this case, the added VCXOs may be connected to the power switching circuit 10 and the output switching circuit 11.

Even in this case, the resistors included in each VCXO are the same type of components as each other in the respective VCXOs, and the variable-capacitance diode included in each VCXO are the same type of components as each other in the respective VCXOs.

Further, as the resonator X11 and the resonator X21, for example, various resonators such as an AT-cut quartz crystal resonator, a tuning fork type quartz crystal resonator, and a surface acoustic wave resonator are used. The quartz crystal resonator is preferably used among them, from the viewpoint of obtaining a fundamental frequency with high frequency accuracy. Accordingly, an oscillator circuit 1 with high frequency accuracy is obtained.

2. Oscillator

The embodiment of the oscillator according to the invention will be described below.

Figure 2:
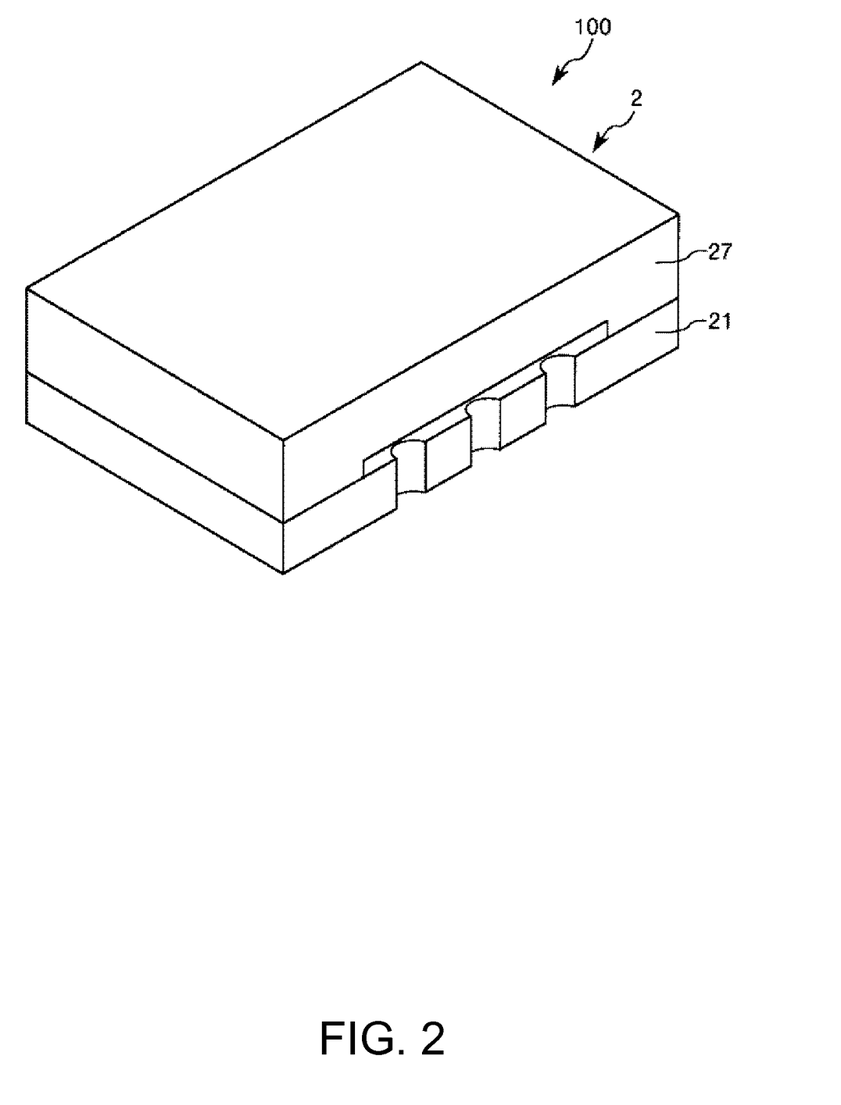
FIG. 2 is a perspective view illustrating an appearance of an oscillator (an embodiment of an oscillator according to the invention) including the oscillator circuit illustrated in FIG. 1.
Figure 3:
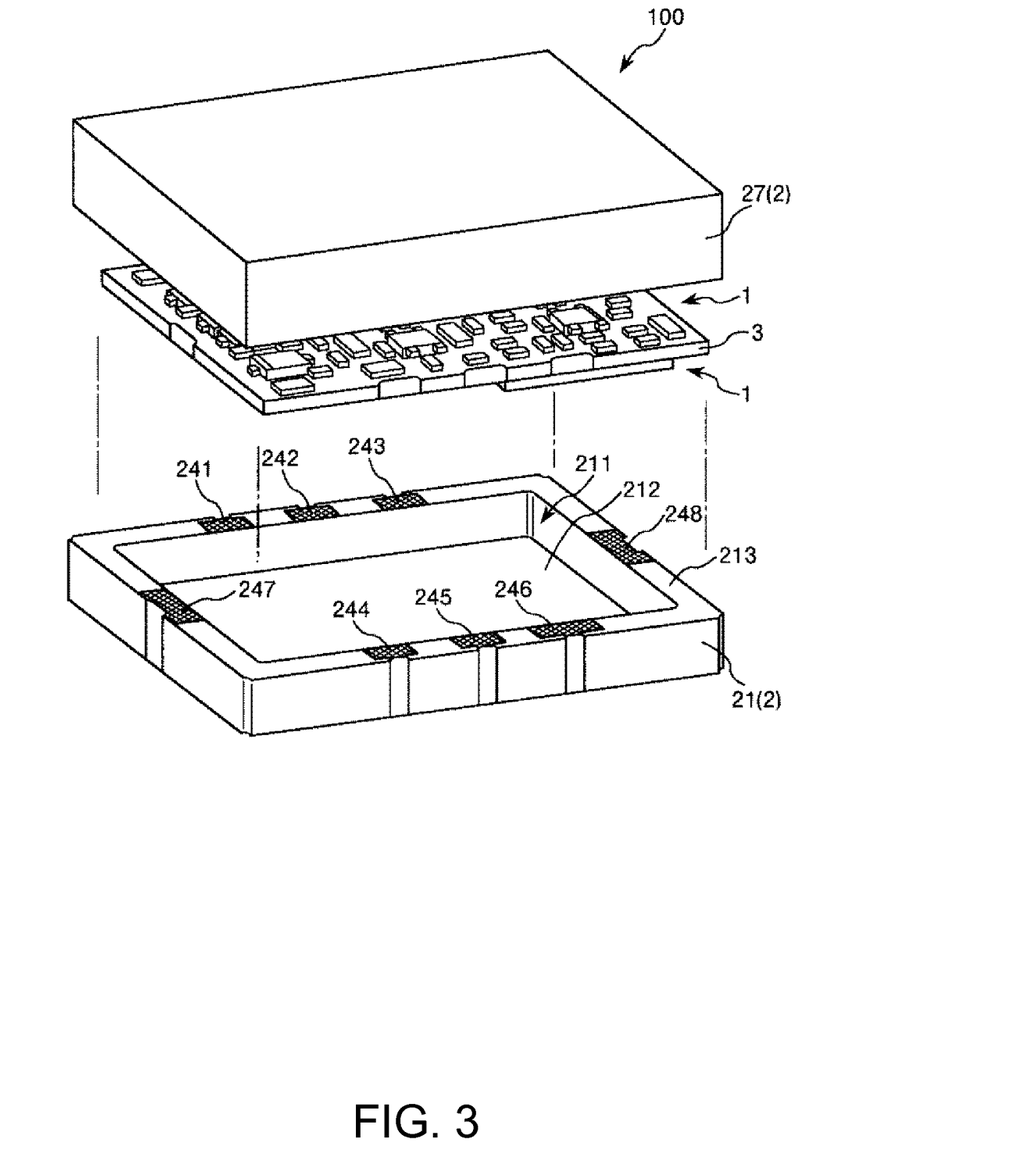
FIG. 3 is an exploded perspective view of the oscillator illustrated in FIG. 2.

FIG. 2 is a perspective view illustrating an appearance of an oscillator (an embodiment of an oscillator according to the invention) including the oscillator circuit illustrated in FIG. 1, and FIG. 3 is an exploded perspective view of the oscillator illustrated in FIG. 2.

The oscillator 100 illustrated in FIGS. 2 and 3 includes a package 2, a supporting substrate 3 fixed in the package 2, and an oscillator circuit 1 mounted on the supporting substrate 3.

Among them, the package 2 includes a base substrate 21, and a lid (cover) 27 bonded to the base substrate 21. In the package 2, an internal space is provided between the base substrate 21 and the lid 27, and the supporting substrate 3 is accommodated in the internal space. Since the oscillator circuit 1 is accommodated in such a package 2, it is possible to protect the oscillator circuit 1 from external force and environmental change, thereby allowing improvement in the reliability of the oscillator 100.

The base substrate 21, as illustrated in FIG. 3, has a box-shape including a recess 211, of which the top surface opens. In other words, the base substrate 21 includes a plate-shaped bottom plate 212, and a frame-shaped side wall 213 that is erected from the edge of the upper surface of the bottom plate 212.

Further, eight internal terminals 241, 242, 243, 244, 245, 246, 247, and 248 are provided on the upper surface of the base substrate 21, and external connection terminals, not shown, which are electrically connected to these internal terminals are provided on the lower surface of the base substrate 21. These external connection terminals are connected to the control voltage terminal 61, the power supply terminal 62, the oscillator output terminal 63, the selection signal terminal 64, and the ground terminal 65 of the above-described oscillator circuit 1, through wirings, not shown.

Further, a circuit connection terminal, not shown, is provided on the side surface of the supporting substrate 3, and the circuit connection terminal and the above-described inner terminals 241, 242, 243, 244, 245, 246, 247, and 248 are electrically connected, through a conductive bonding member, not shown, in a state where the supporting substrate 3 is placed on the base substrate 21.

The constituent material of the insulation portions of the package 2 and the supporting substrate 3 is obtained, by performing a sintering process on ceramic green sheets made of, for example, aluminum oxide, aluminum nitride, silicon carbide, mullite, and glass-ceramic.

Meanwhile, the constituent material of the conductive portions of the package 2 and the supporting substrate 3 is obtained by coating, for example, an underlying layer of tungsten (W), molybdenum (Mo), or the like with a plating layer of gold (Au), copper (Cu), or the like.

Figure 4:
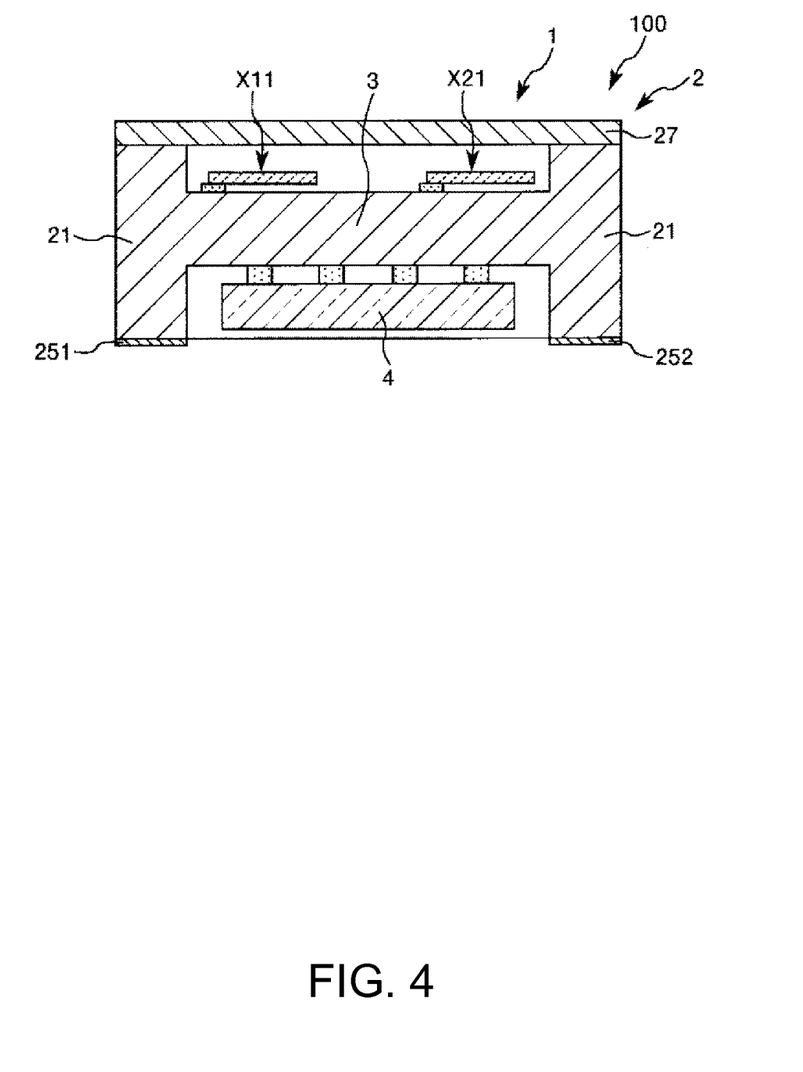
FIG. 4 is a longitudinal sectional view illustrating another configuration example of the embodiment of the oscillator according to the invention.

FIG. 4 is a longitudinal sectional view illustrating another configuration example of the embodiment of the oscillator according to the invention.

The oscillator 100 illustrated in FIG. 4 includes a package 2, a supporting substrate 3 fixed in the package 2, and an oscillator circuit 1 mounted on the supporting substrate 3. In the following description, the upper part in FIG. 4 is referred to as "up", and the lower part thereof is referred to as "down".

In the oscillator 100 illustrated in FIG. 4, the resonator X11 included in the first VCXO 7 and the resonator X21 included in the second VCXO 8 are mounted on the upper surface of the supporting substrate 3 in the oscillator circuit 1. Meanwhile, at least a portion of the resistor, the variable-capacitance diode, the capacitor, and the transistor which are included in the first VCXO 7, and the resistor, the variable-capacitance diode, the capacitor, and the transistor which are included in the second VCXO 8 in the oscillator circuit 1 are integrated into an integrated circuit element 4, and the integrated circuit element 4 is mounted on the lower surface of the supporting substrate 3.

Further, external connection terminals 251 and 252 are provided on the lower surface of the package 2.

According to the oscillator 100, it is possible to reduce the number of discrete components constituting the oscillator circuit 1, such that miniaturization is achieved and manufacturability is improved.

3. Electronic Apparatus

Next, electronic apparatuses having the oscillator according to the invention (the electronic apparatus according to the invention) will be described in detail, based on FIG. 5 to FIG. 8.

Figure 5:
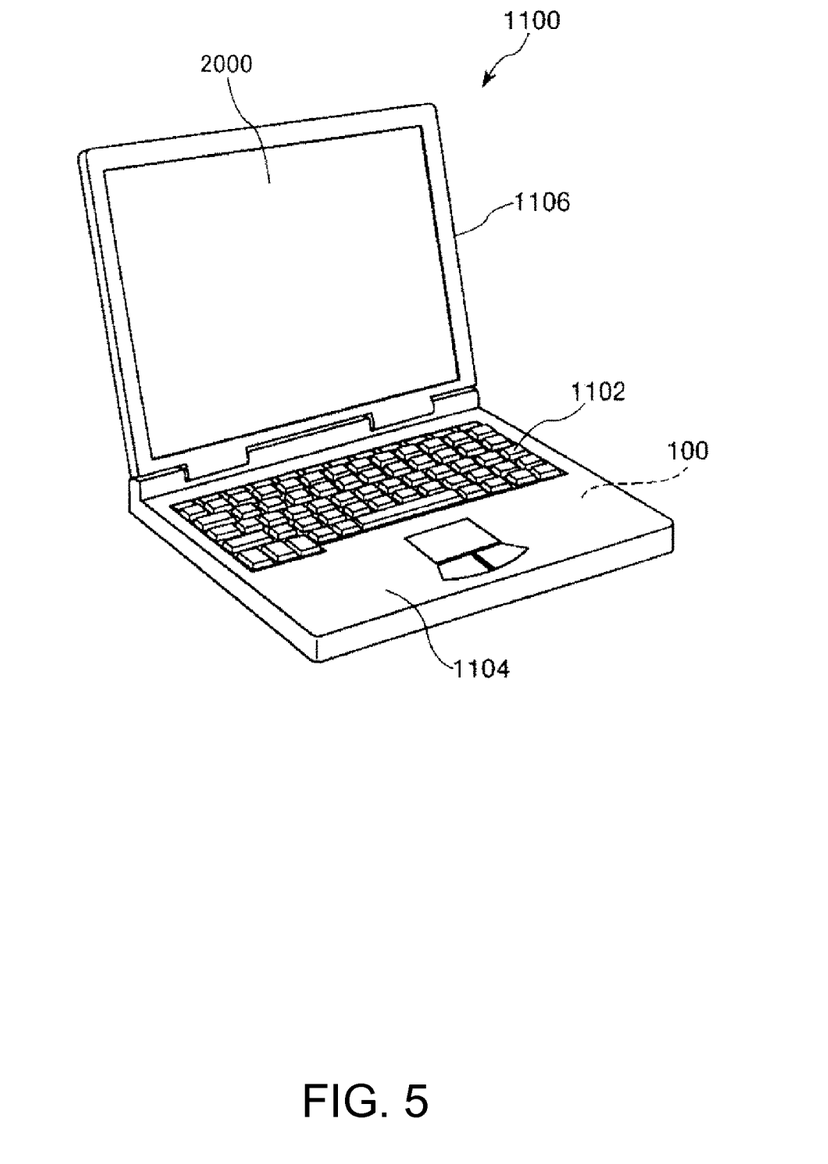
FIG. 5 is a perspective view illustrating a configuration of a mobile type (or a notebook type) personal computer which is a first example of an electronic apparatus according to the invention.

FIG. 5 is a perspective view illustrating a configuration of a mobile type (or a notebook type) personal computer which is a first example of the electronic apparatus according to the invention. In this FIG. 5, a personal computer 1100 includes a main body 1104 having a keyboard 1102, and a display unit 1106 having a display 2000. The display unit 1106 is rotatably supported with respect to the main body 1104 through a hinge structure. Such a personal computer 1100 includes the built-in oscillator 100.

Figure 6:
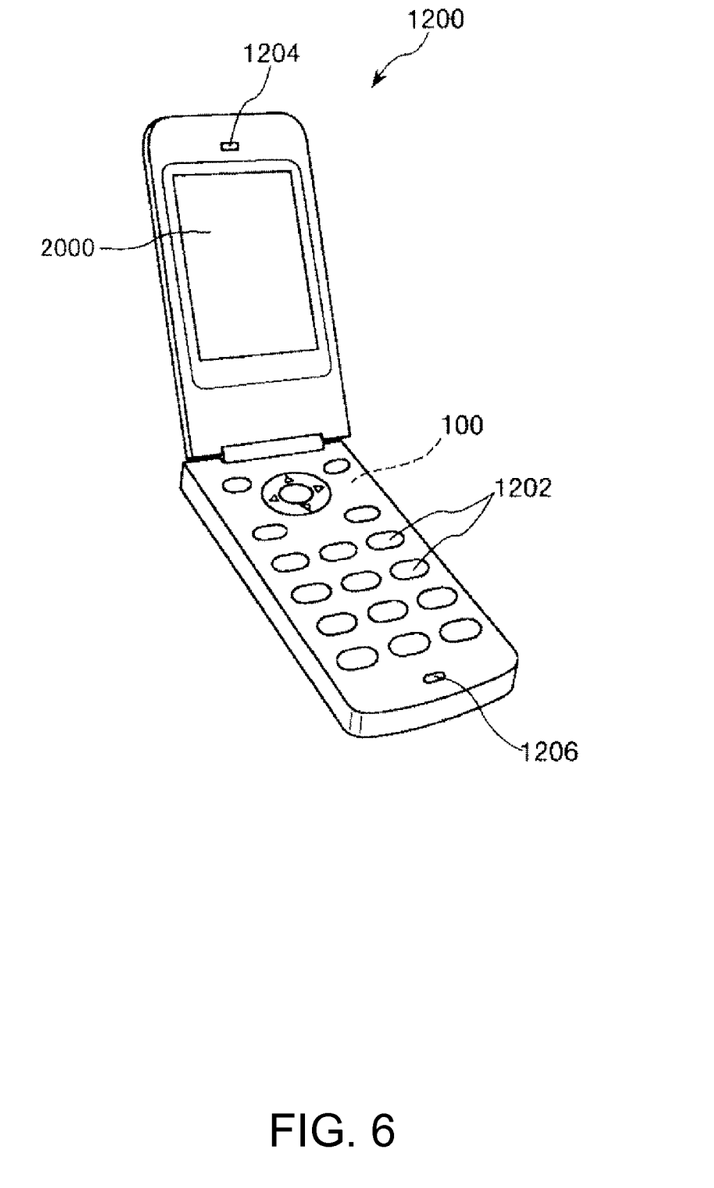
FIG. 6 is a perspective view illustrating a configuration of a mobile phone (including a PHS) which is a second example of the electronic device according to the invention.

FIG. 6 is a perspective view illustrating a configuration of a mobile phone (including a PHS) which is a second example of the electronic device according to the invention. In this FIG. 6, a mobile phone 1200 includes a plurality of operation buttons 1202, an earpiece 1204, and a mouthpiece 1206, and a display portion 2000 is disposed between the operation buttons 1202 and the earpiece 1204. Such a mobile phone 1200 includes the built-in oscillator 100.

Figure 7:
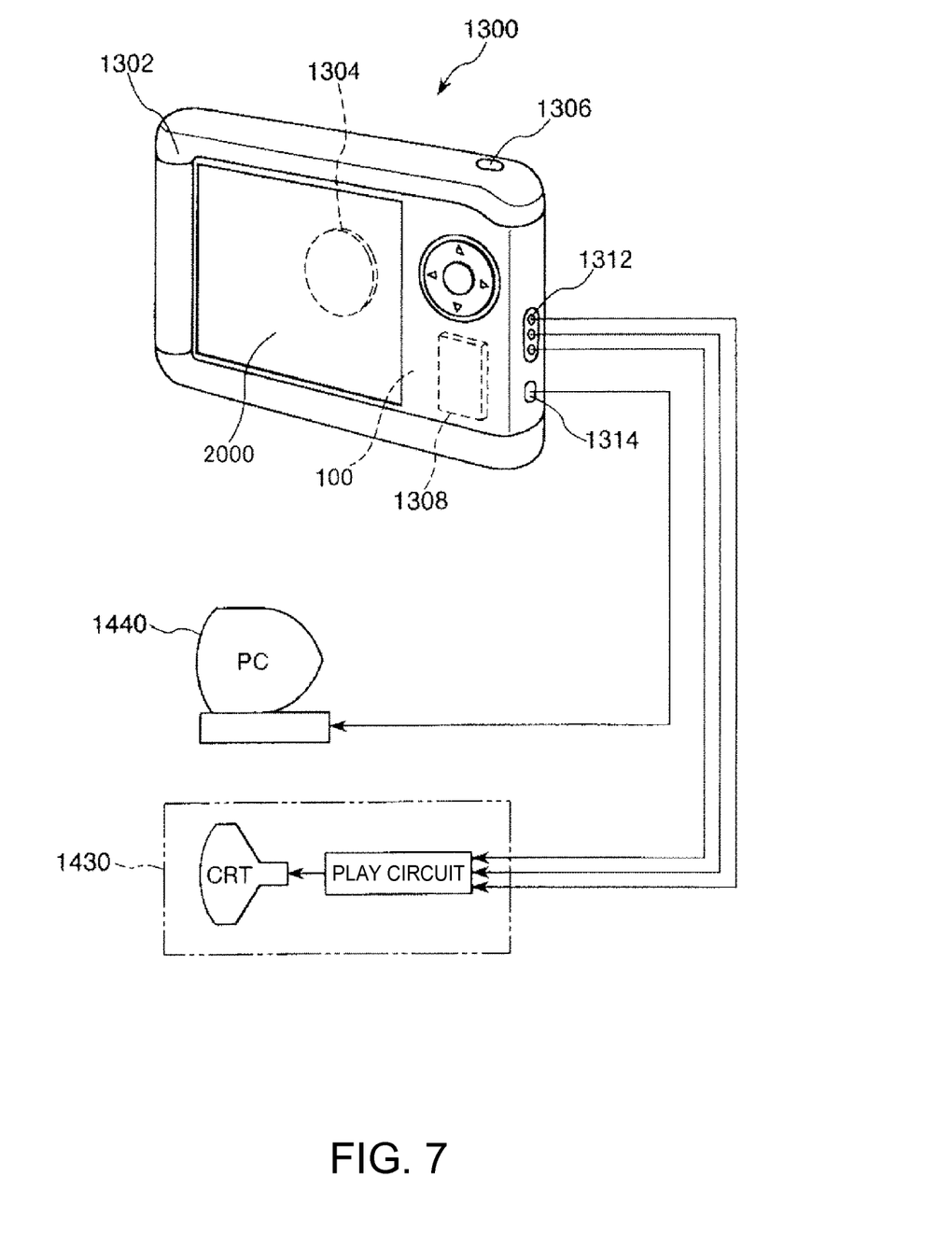
FIG. 7 is a perspective view illustrating a configuration of a digital still camera which is a third example of the electronic device according to the invention.

FIG. 7 is a perspective view illustrating a configuration of a digital still camera which is a third example of the electronic device according to the invention. In addition, in this FIG. 7, the connection with an external device is illustrated in a simplified manner. Whereas in a general camera, a silver salt film is exposed to the optical image of an object, a digital still camera 1300 photoelectrically converts an optical image of an object by an image pickup device such as a charge coupled device (CCD) and generates an imaging signal (video signal).

A display unit 2000 is provided on the back surface of the case (body) 1302 which the digital still camera 1300 has therein, and is configured to perform display based on the imaging signal by the CCD, and the display unit 2000 functions as a viewfinder that displays the object as an electronic image. Further, a light receiving unit 1304 including an optical lens (an imaging optical system) and a CCD are provided on the front surface of the case 1302 (the back side in the FIG. 7).

If a photographer confirms an object image displayed on the display 2000, and presses a shutter button 1306, the imaging signal of the CCD at that time is transferred to and stored in the memory 1308. Further, in the digital still camera 1300, a video signal output terminal 1312 and an input output terminal 1314 for data communication are provided in the side surface of the case 1302. As illustrated in FIG. 7, a TV monitor 1430 and a personal computer 1440 are respectively connected as required to the video signal output terminal 1312 and the input output terminal 1314 for data communication. Further, it is configured that the imaging signal stored in the memory 1308 is output to the television monitor 1430 or the personal computer 1440 by a predetermined operation. Such a digital still camera 1300 includes the built-in oscillator 100.

Figure 8:
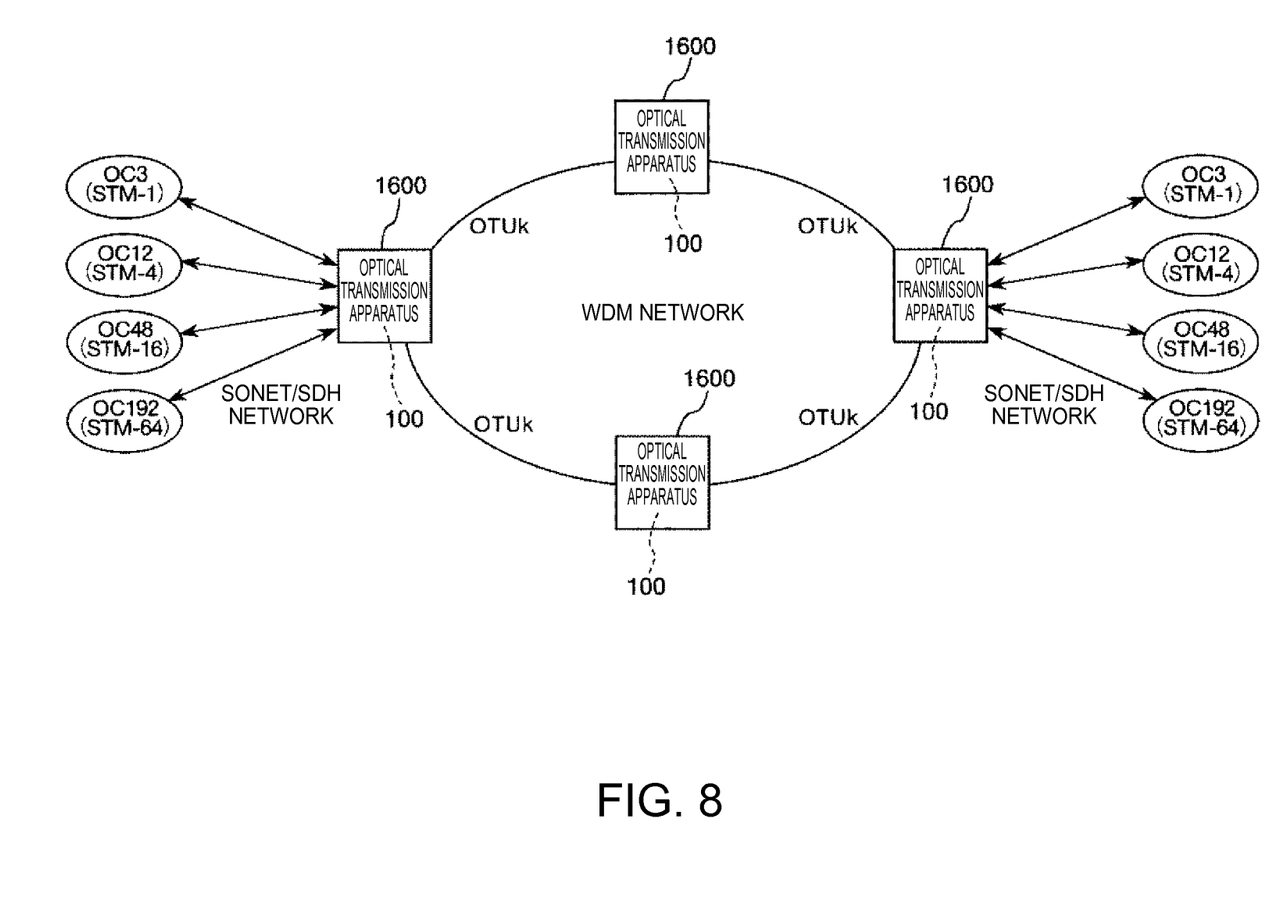
FIG. 8 is a schematic diagram of a network including an optical transmission apparatus according to a fourth example of the electronic apparatus according to the invention.

FIG. 8 is a schematic diagram of a network including an optical transmission apparatus according to a fourth example of the electronic apparatus according to the invention. In this FIG. 8, an optical transmission apparatus 1600 is arranged at a boundary between a SONET/SDH network and a wavelength division multiplexing (WDM) network, and converts a client signal transmitted to the SONET/SDH network and an OTUk (k=2, 3) signal transmitted through the WDM network to each other. In the example of FIG. 8, examples of the client signal include an OC3/STM-1 signal, an OC12/STM-4 signal, an OC48/STM-16 signal, and an OC192/STM-64 signal.

Such an optical transmission apparatus 1600 includes a clock generator that generates a clock corresponding to the client signal, and the oscillator 100 is built into the clock generator. The clock generating unit is adapted to output clocks having different frequencies depending on client signals having different transmission bit rates. In such a case, it is possible to easily output clocks of different frequencies by providing the two-frequency switching type oscillator 100.

Further, in addition to the personal computer (mobile personal computer) in FIG. 5, the mobile phone in FIG. 6, the digital still camera in FIG. 7, and the optical transmission apparatus in FIG. 8, the electronic apparatus including the oscillator according to the invention is applicable to ink-jet type discharge devices (for example, ink jet printers), laptop personal computers, TVs, video cameras, video recorders, car navigation devices, pagers, electronic notebooks (having communication functions), electronic dictionaries, calculators, electronic game machines, word processors, workstations, TV phones, security television monitors, electronic binoculars, POS terminals, medical equipment (for example, electronic thermometers, blood pressure meters, blood glucose meters, electrocardiogram measurement apparatuses, ultrasonic diagnostic equipment, electronic endoscopes), fish finders, various types of measurement equipment, instruments (for example, vehicles, aircrafts, ship gauges), flight simulators or the like.

4. Moving Object

Figure 9:
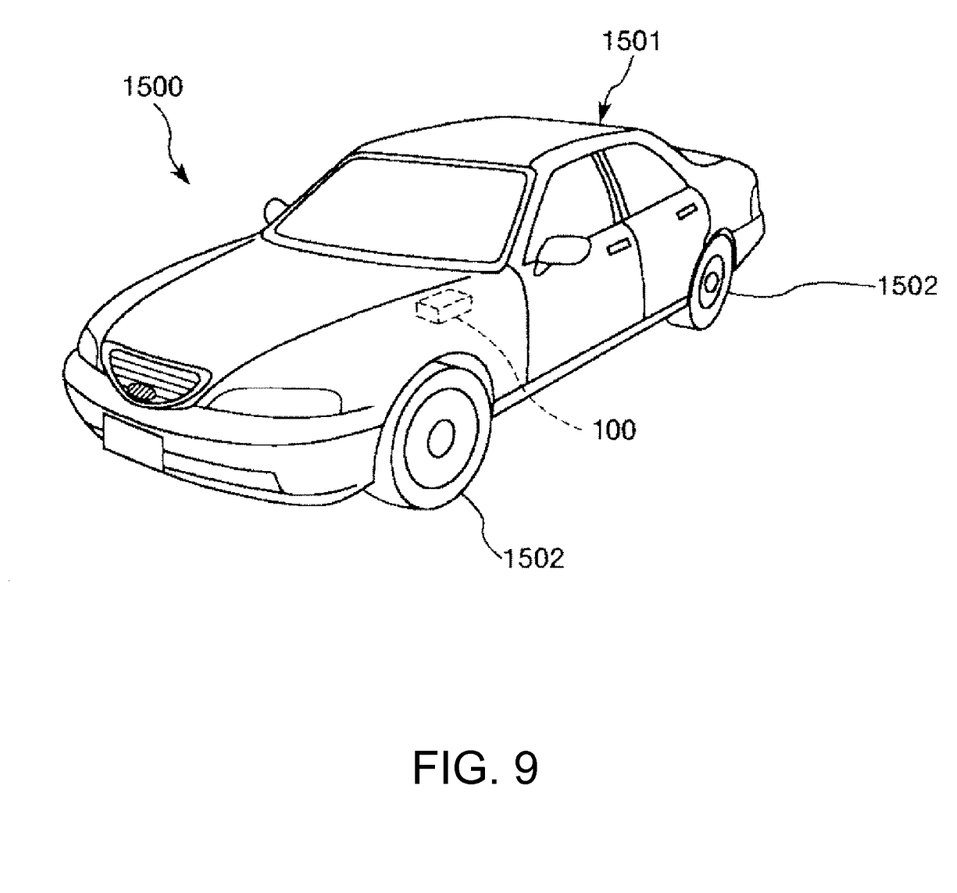
FIG. 9 is a perspective view illustrating a configuration of a vehicle which is an example of a moving object according to the invention.

FIG. 9 is a perspective view illustrating a configuration of a vehicle which is an example of a moving object according to the invention.

In FIG. 9, a moving object 1500 includes a body 1501, and four wheels 1502, and is configured to rotate the wheels 1502 through a power source (an engine) (not shown) provided in the vehicle body 1501. Such a moving object 1500 includes the built-in oscillator 100.

In addition, the moving object according to the invention is not limited to a vehicle, and is applicable to, for example, various moving objects such as aircrafts, ships, and motorcycles.

Hitherto, the oscillator, the electronic apparatus, and the moving object according to the invention have been described based on the respective embodiments, but the invention is not limited thereto, and the configuration of each part can be replaced with any configuration having a similar function. Further, other arbitrary components may be added.

The entire disclosure of Japanese Patent Application No. 2014-193979, filed Sep. 24, 2014 is expressly incorporated by reference herein.

What is claimed is:

1. An oscillator comprising:
a supporting substrate;
a first voltage-controlled oscillator circuit capable of changing an output frequency by application of a control voltage;
a second voltage-controlled oscillator circuit capable of changing an output frequency by application of the control voltage; and
a control voltage terminal to which the control voltage is applied,
wherein the first voltage-controlled oscillator circuit includes a first variable-capacitance diode to which the control voltage is applied, and a first resistor provided between the control voltage terminal and the first variable-capacitance diode,
wherein the second voltage-controlled oscillator circuit includes a second variable-capacitance diode to which the control voltage is applied, and a second resistor provided between the control voltage terminal and the second variable-capacitance diode,
wherein a cutoff frequency when the control voltage is applied to the first variable-capacitance diode, the second variable-capacitance diode, the first resistor, and the second resistor is equal to a cutoff frequency when the control voltage is applied to the first variable-capacitance diode and the first resistor, and a cutoff frequency when the control voltage is applied to the second variable-capacitance diode and the second resistor, wherein the first variable-capacitance diode and the second variable-capacitance diode are the same type of components as each other, wherein the first resistor and the second resistor are the same type of components as each other, and wherein the first variable-capacitance diode, the second variable-capacitance diode, the first resistor, and the second resistor are mounted on the supporting substrate.

2. An oscillator comprising:

a semiconductor substrate;

a first voltage-controlled oscillator circuit capable of changing an output frequency by application of a control voltage;

a second voltage-controlled oscillator circuit capable of changing an output frequency by application of the control voltage; and a control voltage terminal to which the control voltage is applied, wherein the first voltage-controlled oscillator circuit includes a first variable-capacitance diode to which the control voltage is applied, and a first resistor provided between the control voltage terminal and the first variable-capacitance diode, wherein the second voltage-controlled oscillator circuit includes a second variable-capacitance diode to which the control voltage is applied, and a second resistor provided between the control voltage terminal and the second variable-capacitance diode, wherein a cutoff frequency when the control voltage is applied to the first variable-capacitance diode, the second variable-capacitance diode, the first resistor, and the second resistor is equal to a cutoff frequency when the control voltage is applied to the first variable-capacitance diode, and the first resistor, and a cutoff frequency when the control voltage is applied to the second variable-capacitance diode and the second resistor, wherein the first variable-capacitance diode and the second variable-capacitance diode are the same type of components as each other, wherein the first resistor and the second resistor are the same type of components as each other, and wherein the first variable-capacitance diode, the second variable-capacitance diode, the first resistor, and the second resistor are integrated with the semiconductor substrate.

3. The oscillator according to claim 1, further comprising:

a power switching circuit that supplies a power supply voltage to any one of the first voltage-controlled oscillator circuit and the second voltage-controlled oscillator circuit.

4. The oscillator according to claim 2, further comprising:

a power switching circuit that supplies a power supply voltage to any one of the first voltage-controlled oscillator circuit and the second voltage-controlled oscillator circuit.

5. The oscillator according to claim 1, further comprising:

an oscillator output terminal for outputting output signals of the first voltage-controlled oscillator circuit and the second voltage-controlled oscillator circuit; and an output switching circuit, wherein the first voltage-controlled oscillator circuit further includes a first output terminal, wherein the second voltage-controlled oscillator circuit further includes a second output terminal, and wherein the output switching circuit switches connection between the first output terminal and the oscillator output terminal and connection between the second output terminal and the oscillator output terminal.

6. The oscillator according to claim 2, further comprising:

an oscillator output terminal for outputting output signals of the first voltage-controlled oscillator circuit and the second voltage-controlled oscillator circuit; and an output switching circuit, wherein the first voltage-controlled oscillator circuit further includes a first output terminal, wherein the second voltage-controlled oscillator circuit further includes a second output terminal, and wherein the output switching circuit switches connection between the first output terminal and the oscillator output terminal and connection between the second output terminal and the oscillator output terminal.

7. The oscillator according to claim 3, further comprising:

an oscillator output terminal for outputting output signals of the first voltage-controlled oscillator circuit and the second voltage-controlled oscillator circuit; and an output switching circuit, wherein the first voltage-controlled oscillator circuit further includes a first output terminal, wherein the second voltage-controlled oscillator circuit further includes a second output terminal, and wherein the output switching circuit switches connection between the first output terminal and the oscillator output terminal and connection between the second output terminal and the oscillator output terminal.

8. The oscillator according to claim 4, further comprising:

an oscillator output terminal for outputting output signals of the first voltage-controlled oscillator circuit and the second voltage-controlled oscillator circuit; and an output switching circuit, wherein the first voltage-controlled oscillator circuit further includes a first output terminal, wherein the second voltage-controlled oscillator circuit further includes a second output terminal, and wherein the output switching circuit switches connection between the first output terminal and the oscillator output terminal and connection between the second output terminal and the oscillator output terminal.

9. The oscillator according to claim 1, wherein the first voltage-controlled oscillator circuit and the second voltage-controlled oscillator circuit respectively include a quartz crystal oscillation unit, and a tuning circuit that tunes the output frequency into a frequency of a high-order wave output from the quartz crystal oscillation unit.

10. The oscillator according to claim 2, wherein the first voltage-controlled oscillator circuit and the second voltage-controlled oscillator circuit respectively include a quartz crystal oscillation unit, and a tuning circuit that tunes a frequency into a frequency of a high-order wave output from the quartz crystal oscillation unit.

11. The oscillator according to claim 3, wherein the first voltage-controlled oscillator circuit and the second voltage-controlled oscillator circuit respectively include a quartz crystal oscillation unit, and a tuning circuit that tunes a frequency into a frequency of a high-order wave output from the quartz crystal oscillation unit.

12. The oscillator according to claim 5,
wherein the first voltage-controlled oscillator circuit and the second voltage-controlled oscillator circuit respectively include a quartz crystal oscillation unit, and a tuning circuit that tunes a frequency into a frequency of a high-order wave output from the quartz crystal oscillation unit.

13. The oscillator according to claim 1, further comprising:
a package that houses the first voltage-controlled oscillator circuit and the second voltage-controlled oscillator circuit.

14. The oscillator according to claim 2, further comprising:
a package that houses the first voltage-controlled oscillator circuit and the second voltage-controlled oscillator circuit.

15. The oscillator according to claim 3, further comprising:
a package that houses the first voltage-controlled oscillator circuit and the second voltage-controlled oscillator circuit.

16. The oscillator according to claim 5, further comprising:
a package that houses the first voltage-controlled oscillator circuit and the second voltage-controlled oscillator circuit.

17. The oscillator according to claim 9, further comprising:
a package that houses the first voltage-controlled oscillator circuit and the second voltage-controlled oscillator circuit.

18. An electronic apparatus comprising:
oscillator according to claim 1.

19. A moving object comprising:
oscillator according to claim 1.

* * * * *